(12) United States Patent
Fiolka

(10) Patent No.: US 7,551,261 B2
(45) Date of Patent: Jun. 23, 2009

(54) ILLUMINATION SYSTEM FOR A MICROLITHOGRAPHY PROJECTION EXPOSURE INSTALLATION

(75) Inventor: Damian Fiolka, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/590,783

(22) PCT Filed: Feb. 24, 2005

(86) PCT No.: PCT/EP2005/001949

§ 371 (c)(1),
(2), (4) Date: Jun. 25, 2007

(87) PCT Pub. No.: WO2005/083512

PCT Pub. Date: Sep. 9, 2005

(65) Prior Publication Data

US 2007/0279535 A1    Dec. 6, 2007

(30) Foreign Application Priority Data

Feb. 26, 2004    (DE) .................. 10 2004 010 571

(51) Int. Cl.
  G03B 27/54    (2006.01)
  G03B 27/42    (2006.01)
(52) U.S. Cl. .......................... 355/67; 355/53
(58) Field of Classification Search .............. 355/67, 355/53, 71; 427/552; 359/622; 348/744
  See application file for complete search history.

(56) References Cited

U.S. PATENT DOCUMENTS

| 5,576,801 | A | 11/1996 | Ushida et al. |
| 5,760,963 | A | 6/1998 | Mori et al. |
| 5,926,257 | A | 7/1999 | Mizouchi et al. |
| 6,211,944 | B1 | 4/2001 | Shiraishi |
| 6,252,647 | B1 | 6/2001 | Shiraishi |
| 2001/0028925 | A1* | 10/2001 | Moshrefzadeh et al. ..... 427/552 |

FOREIGN PATENT DOCUMENTS

| EP | 0 949 541 A2 | 10/1999 |
| EP | 1 109 067 A2 | 6/2001 |

OTHER PUBLICATIONS

Patent Abstracts of Japan, vol. 1998, No. 8, Jun. 30, 1998; JP 10 070070 A (Canon Inc.), Abstract Figures 1-4.

* cited by examiner

Primary Examiner—Peter B Kim
(74) Attorney, Agent, or Firm—Sughrue Mion, PLLC

(57) ABSTRACT

An illumination system for a microlithography projection exposure apparatus has a light distribution device (21), which generates a two-dimensional intensity distribution from the light from a primary light source, for example a laser, in a first surface (25) of the illumination system. A fly's eye condenser (55) having a first and a second raster arrangement (40) of optical elements serves as a light mixing device for homogenizing the illumination in the illumination field of the illumination system. The fly's eye condenser has a first raster arrangement (35) of first raster elements (36) and also a second raster arrangement (40) of second raster elements (41). The light distribution device comprises at least one diffractive optical element (21) for generating an angular distribution whose far field has separate or contiguous luminous zones which are coordinated with the form and size of the first raster elements (36).

20 Claims, 3 Drawing Sheets

ILLUMINATION SYSTEM FOR A MICROLITHOGRAPHY PROJECTION EXPOSURE INSTALLATION

Figure 1:
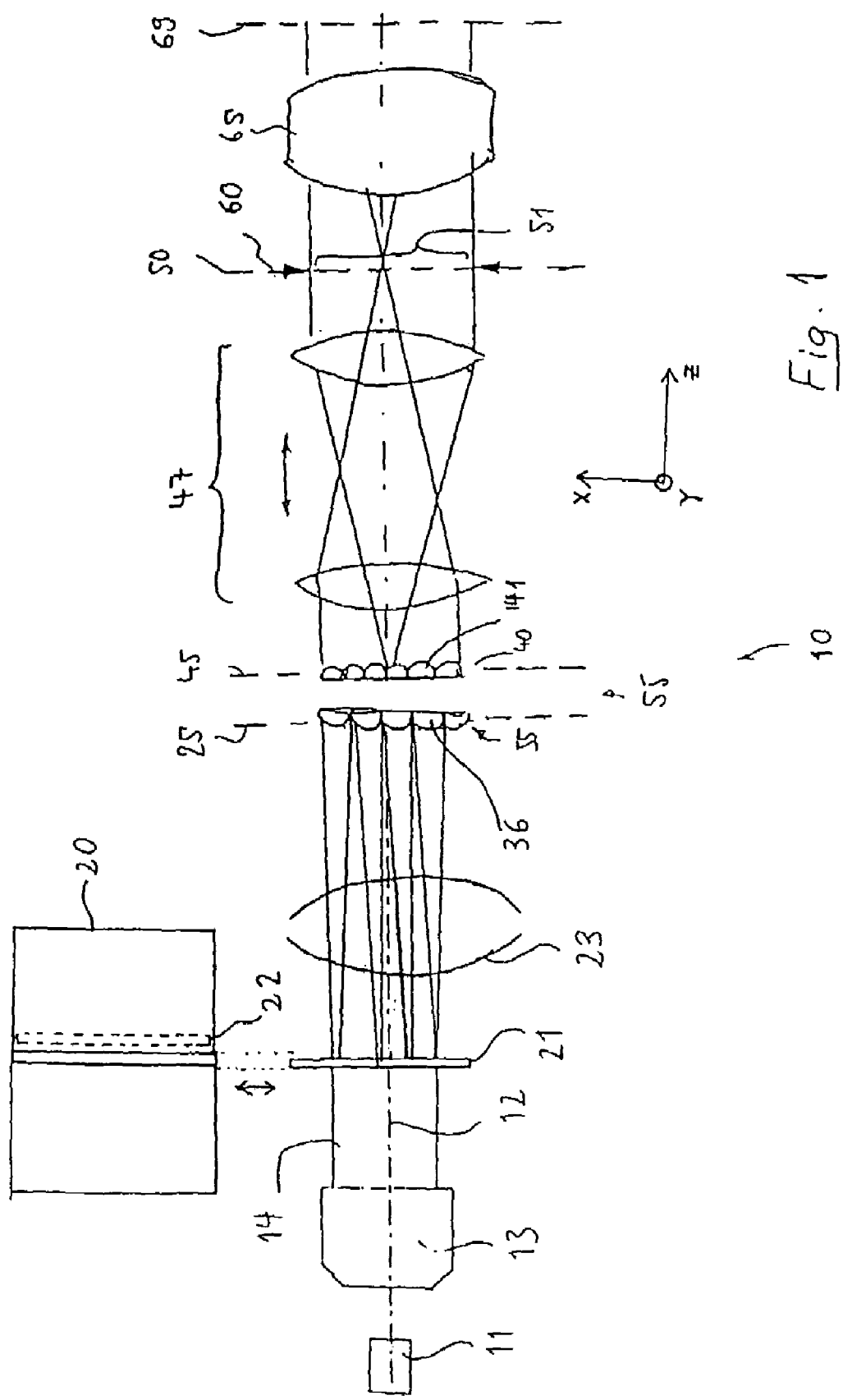

This application is a National Stage of International Application No. PCT/EP2005/001949 filed Feb. 24, 2005, which claims the benefit of German Application No. 10 2004 010 571.5, filed Feb. 26, 2004.

The invention relates to an illumination system for a microlithography projection exposure apparatus for illuminating an illumination field with the light from a primary light source.

The performance of projection exposure apparatuses for the microlithographic production of semiconductor components and other finely structured devices is substantially determined by the imaging properties of the projection objectives. Furthermore, the image quality and the wafer throughput that can be achieved with an apparatus are substantially concomitantly determined by properties of the illumination system disposed upstream of the projection objective. Said illumination system must be able to transform the light from a primary light source, for example a laser, with maximum efficiency into an intensity distribution of a secondary light source that is favorable for the optical projection and in the process to generate an intensity distribution that is as uniform as possible in an illumination field of the illumination system. If illumination systems with variably adjustable illumination modes are involved, the specification requirements made of the illumination are to be met equally for all illumination modes, for example in the case of conventional settings with different degrees of coherence or in the case of annular field, dipole or quadrupole illumination. These illumination modes are optionally set in order to optimize the illumination according to the structures of the individual originals (masks) to be imaged.

A demand imposed on illumination systems that is becoming increasingly important is that they are to be able to provide output light for the illumination of a mask (reticle) with a polarization state that can be defined as accurately as possible. By way of example, it may be desirable for the light that is incident on the photomask or in the downstream projection objective to be largely or completely linearly polarized. With linearly polarized input light, e.g. catadioptric projection objectives with a polarization beam splitter (beam splitter cube, BSC) can operate with a high transmission efficiency. It may also be desirable to provide largely unpolarized or circularly, tangentially or radially polarized light in the region of the photomask, for example in order to avoid resolution differences dependent on structure direction.

A high degree of uniformity or homogeneity of the illumination falling onto the photomask (reticle) can be achieved by mixing the light coming from the light source with the aid of a light mixing device. In the case of light mixing devices a distinction is made essentially between light mixing devices with fly's eye condensers and light mixing devices with integrator rods or light mixing rods. These systems have specific advantages and disadvantages.

Systems with integrator rods are distinguished by a superior transmission efficiency. They often operate with unpolarized input light, which is advantageous for the imaging for example with regard to the structure direction dependence of the resolution or with regard to problems with the generation of microscopic intensity maxima (speckles) caused by self-interference of the laser light. One disadvantage of these light mixing systems is that they alter a given polarization state of the input light.

By contrast, systems with a fly's eye condenser for light mixing can largely maintain the polarization of the input light. This is expedient for example when the projection objective is to be operated with polarized light and the light source used is a laser whose output light is already practically completely polarized. Systems with fly's eye condensers have other disadvantages, however. By way of example, it is generally not possible to continuously vary the degree of coherence of the illumination (σ value) without any loss of efficiency. Difficulties arise particularly when using annular or polar illumination. However, these illumination parameters have a great significance for the lithographic imaging particularly in the case of small k factors (k=0.3-0.5). Systems with fly's eye condensers generally require diaphragms for masking out part of the light energy passing through, for example in order not to adversely affect the uniformity of the illumination. Diaphragms in such systems often also serve to obtain annular illumination or polar illumination (e.g. dipole or quadrupole illumination) by masking out part of the light intensity. Systems with fly's eye condensers for light mixing are generally also sensitive with regard to the generation of the abovementioned speckle effects that lead to nonuniform illumination on a microscopic scale.

A fly's eye condenser in the sense of this application has at least one raster arrangement of optical raster elements (fly's eye elements) in order to shape from a light bundle falling onto the raster arrangement a number of light bundles corresponding to the number of illuminated raster elements, the light bundles being spatially separate from one another. If the light from extended light sources is to be homogenized and adapted to a specific field form, a multistage construction is required. In this case, a raster arrangement of first raster elements generates from the incident light a raster arrangement of secondary light sources, the number of which corresponds to the number of illuminated first raster elements. The form of the first raster elements is intended essentially to correspond to the form of the field to be illuminated. Therefore, they are also referred to as field fly's eye elements. A downstream raster arrangement of second raster elements serves for imaging the first raster elements into the illumination surface in which the illumination field arises, and in the process for superimposing the light from the secondary light sources in the illumination field. The second raster elements are often referred to as pupil fly's eye elements. The first and the second raster elements are usually assigned to one another in pairs and form a number of optical channels whose different light intensities are superimposed in the illumination field in the sense of a homogenization of the intensity distribution.

The patents U.S. Pat. Nos. 6,211,944 B1, 6,252,647 B1 and 5,576,801 show examples of the use of fly's eye condensers as light mixing elements in illumination systems of microlithographic projection exposure apparatuses. The use of spatial filters in conjunction with fly's eye condensers for setting specific illumination modes such as annular illumination, dipole illumination or quadrupole illumination is also described.

The patent EP 0 949 541 A2 shows examples of illumination systems wherein different diffractive optical elements in combination with axicons and zoom elements can be used to set different multipole illumination modes, wherein at least one spatial parameter can be varied continuously. Inter alia, a fly's eye condenser is used as a light mixing device in this illumination system.

The invention is based on the object of providing an illumination system for a microlithographic projection exposure apparatus which has a largely polarization-maintaining light mixing device and is designed for generating an essentially homogeneous light distribution in a field plane of the illumination system. In particular, the illumination system is intended to be distinguished by high transmission (little loss of light) and a simple construction.

In order to achieve this object, the invention provides an illumination system having the features of claim 1. Advantageous developments are specified in the dependent claims. The wording of all the claims is incorporated in the content of the description by reference.

An illumination system according to the invention is intended to be suitable for application in a microlithography projection exposure apparatus and serves for illuminating an illumination field arranged in an illumination surface of the illumination system with the light from a primary light source. This normally planar illumination surface is generally a field plane of the illumination system and, with the illumination system incorporated, may be situated in optically conjugate fashion with respect to the object plane of the projection objective or correspond to said plane. The primary light source used may be, by way of example, a laser operating in the ultraviolet range, which provides for example an operating wavelength of 248 nm, 193 nm, 157 nm or lower. Other light sources and/or shorter or longer wavelengths are also possible. The illumination system comprises a plurality of optical systems arranged along its optical axis. A light distribution device serves for receiving light from the primary light source and for generating a two-dimensional intensity distribution that can be predetermined by the configuration of the light distribution device from the light from the primary light source in a first surface of the illumination system. A first raster arrangement comprising first raster elements serves for receiving the spatial, two-dimensional intensity distribution and for generating a raster arrangement of secondary light sources, which are images of the primary light source. In this case, the number of secondary light sources corresponds to the number of illuminated first raster elements. A second raster arrangement comprising second raster elements serves for receiving light from the secondary light sources and for at least partially superimposing it in the illumination field. The illumination intensity in the illumination field is thereby homogenized or made more uniform. The second raster arrangement is arranged in the region of a pupil surface of the illumination system. With the illumination system incorporated, said pupil surface may be optically conjugate with respect to a pupil plane of a downstream projection objective, so that the light distribution in the pupil surface of the illumination system essentially determines the light distribution in the pupil of the projection objective.

The light distribution device comprises at least one diffractive optical element for generating an angular distribution whose far field has separate or contiguous luminous zones which are coordinated in terms of form and size with the form and size of the first raster elements of the first raster arrangement. The coordination of the luminous zones with the raster elements means that they can be essentially completely illuminated in each case in a targeted manner. The consequence of this is that there is practically no occurrence of partial illumination of raster elements that adversely affects the homogenizing effect of the fly's eye condenser. In this case, the distribution of the luminous zones on the first raster arrangement is essentially adapted to the form of the desired exit light distribution, the edge of the distribution having a rastering which is predetermined by the form and size of the raster elements. Diffractive optical elements suitable for use in light distribution devices may be designed for use in transmission or in reflection and can be produced with a low outlay.

In one embodiment of the illumination system, the diffractive optical element is designed for setting a two-dimensional intensity distribution in the first surface in such a way that all first raster elements associated with a predetermined exit light distribution are essentially completely illuminated by the intensity distribution, while first raster elements which do not contribute to the exit light distribution remain essentially unilluminated. A particularly uniform illumination of the illumination field can be obtained as a result. In this case, the term exit light distribution denotes the spatial intensity distribution downstream of the second raster arrangement.

In one development of the illumination system, the diffractive optical element is configured in such a way that the luminous zones generate an approximately circular, approximately annular, or approximate dipole or multipole intensity distribution with a rastering corresponding to the form and size of the first raster elements on the first raster elements of the first surface. Such an illumination of the first surface enables, by way of example, exit light distributions with approximately circular intensity distributions having different diameters or degrees of coherence, approximately annular intensity distributions having different ring widths and/or different radii, or approximately polar intensity distributions having, by way of example, two or four illumination centroids distributed symmetrically or asymmetrically with respect to the optical axis of the system.

In one development of the illumination system, no variably adjustable optical component, in particular neither an adjustable axicon system nor a zoom device, is arranged between the primary light source and the first raster arrangement. Therefore, exclusively the at least one diffractive optical element is used for generating the two-dimensional intensity distribution in the first surface of the illumination system. Dispensing with variably adjustable optical components means that the production costs for the illumination system are lowered In one development of the illumination system, the light distribution device comprises a changeover device for exchanging a first diffractive optical element for generating a first, two-dimensional intensity distribution for at least one second diffractive optical element for generating a second, two-dimensional intensity distribution different from the first intensity distribution. The changeover device may be embodied e.g. as a linear changeover unit or as a rotary changeover unit. By exchanging diffractive optical elements, it is possible for different illumination modes to be set in a variable manner. By way of example, it is possible to set different degrees of coherence (σ value) in a variable manner. The degree of coherence is defined as the ratio of the numerical aperture of the illumination system to the numerical aperture of a downstream projection objective. Given knowledge of the illumination modes which are used in a specific illumination system, it is possible to provide exclusively the diffractive optical elements required for generating said modes in the illumination system, so that the user does not incur any additional costs due to unrequired diffractive elements or variable optical systems of complicated construction. The design of the diffractive optical elements made available in an illumination system can be tailored to the user's needs.

In one development of the illumination system, the diffractive optical element has two or more differently structured partial regions which can optionally be introduced into the beam path of the illumination system for the purpose of generating a number of different, two-dimensional light distributions corresponding to the number of partial regions.

Diffractive optical elements having a plurality of partial regions for setting different illumination modes are described e.g. in EP 1 109 067 A2.

In one development of the illumination system, the diffractive optical element is configured in such a way that at least one luminous zone completely illuminates at least one raster element. In the case of complete illumination of raster elements by luminous zones, it is possible, e.g. when generating a circular or annular intensity distribution, to contiguously cover those raster elements with illumination light which contribute to the exit light distribution. In this case, the rastering of the edge of the light distribution in the first surface is predetermined by the form of the raster elements.

In one advantageous embodiment of the illumination system, the diffractive optical element is configured in such a way that at least one luminous zone illuminates with maximum beam power at least one raster element apart from a narrow edge region. With such illumination, the boundary regions between the raster elements are not illuminated or are only illuminated with a greatly reduced intensity, so that these regions, which are also referred to as dead zones, cannot contribute to loss of light or scattered light formation in this case.

In one development of the illumination system, the primary light source is a laser having a divergence $D_L$ in at least one plane containing the light propagation direction of the light. A maximum divergence of the diffractive optical element in the plane is $D_{max}$. A number n of the raster elements of the first raster arrangement, for generating a homogenizing effect, is predetermined such that a defined effective transmittance T of the radiation impinging on the first raster element is not undershot. The "effective transmittance" T is defined here as the ratio of the proportion of radiation impinging on a first raster element with flat top intensity to the total radiation impinging on the raster element. The flat top intensity is the average intensity in the flat top range, which as a rule is not completely constant. The effective transmittance T therefore relates as a ratio the useful light proportion that can be used for the illumination to the sum of the useful light proportion and a light proportion that is to be rejected and should not be used for the illumination if a homogeneous illumination is desired. The "effective transmittance" takes account of the fact that part of the radiation emitted by the raster element may need to be expended in order to achieve a light distribution having the desired homogeneity. Raster elements of identical type are assumed in this case, so that the effective transmittance of each individual raster element is essentially identical and corresponds to the effective transmittance of the raster arrangement. The term divergence here denotes half the aperture angle spanned by the beam in the plane containing the light propagation direction. $D_{Max}$ denotes the angle between the optical axis and the marginal ray that impinges on the outermost edge of the first raster elements furthest away from the optical axis.

The homogenizing effect of the fly's eye condenser depends on the number n of raster elements which contribute to the superimposition in the field plane. The better the intended homogeneity of the illumination light, the more raster elements are generally required. On the other hand, each raster element produces an edge region which causes a decrease in the intensity of the illumination light. It is therefore necessary to find a compromise between a desired value for the effective transmittance of the fly's eye condenser and the homogeneity of the illumination light. For a given number n of raster elements, an effective transmittance T of the raster elements can be determined with the aid of the variables $D_L$ and $D_{max}$. Said effective transmittance should not fall below a specific value, e.g. approximately 70% or 80%.

In one development of the illumination system, the diffractive optical element is embodied as a computer-generated hologram (CGH). Such elements can generate an angular distribution which is advantageously adapted to the form and size of the raster elements of the first raster arrangement. For production, the surface structure of the element that is to be produced is calculated by means of iterative algorithms with a desired angular distribution being prescribed, and the surface structure is produced, e.g. by means of a microlithographic process.

In one embodiment of the illumination system, the raster elements of the first and/or the second raster arrangement are embodied as microlenses. The form of the lenses of the first raster arrangement is adapted to the form of the illumination field, rectangular forms being preferred. In the case of illumination systems for wafer scanners, it is possible, by way of example, to provide rectangular microlenses having a high aspect ratio between width and height.

In one development of the illumination system, a shading diaphragm for generating a sharp edge (bright-dark transition) of the intensity distribution is provided in the vicinity of the illumination surface or in the vicinity of a conjugate plane with respect thereto. The shading diaphragm and the position thereof are designed such that it clips or masks out that part of the intensity distribution in which the intensity is not constant (edge).

In one embodiment of the illumination system, at least one Fourier lens arrangement is arranged between the diffractive optical element and the first raster arrangement. The Fourier lens arrangement, which may comprise one or more lenses, serves for converting the angular distribution generated by the diffractive optical element into a spatial distribution in a field plane downstream of the Fourier lens arrangement. The far field of the diffractive optical element is thus brought by the Fourier lens arrangement from a plane at infinity to the focal plane of the Fourier lens arrangement. This enables compact designs to be realized.

The invention also relates to a method for producing semiconductor components and other finely structured devices, which method involves illuminating a reticle arranged in an object plane of a projection objective with the light from a primary light source with the aid of an illumination system embodied according to the invention, and generating an image of the reticle on a light-sensitive substrate; in this method, for illuminating the reticle, the diffractive optical element generates a two-dimensional intensity distribution in the form of luminous zones on the first surface of the illumination system, spatial distribution of which essentially corresponds to the form of a predeterminable exit light distribution.

In one development of the method, a changeover of illumination modes of the illumination system is carried out exclusively by exchanging the diffractive optical element and/or by optionally introducing differently structured partial regions of the diffractive optical element into the beam path of the illumination system. In the case of this development it is thus possible to completely dispense with adjustable components such as axicon systems or zoom devices for setting illumination modes.

The above and further features emerge not only from the claims but also from the description and the drawings, in which case the individual features may be realized, and may represent embodiments which are advantageous and which are protectable per se, in each case on their own or as a plurality in the form of subcombinations in an embodiment of the invention and in other fields. Exemplary embodiments of the invention are illustrated in the drawings and are explained in more detail below.

Figure 2:
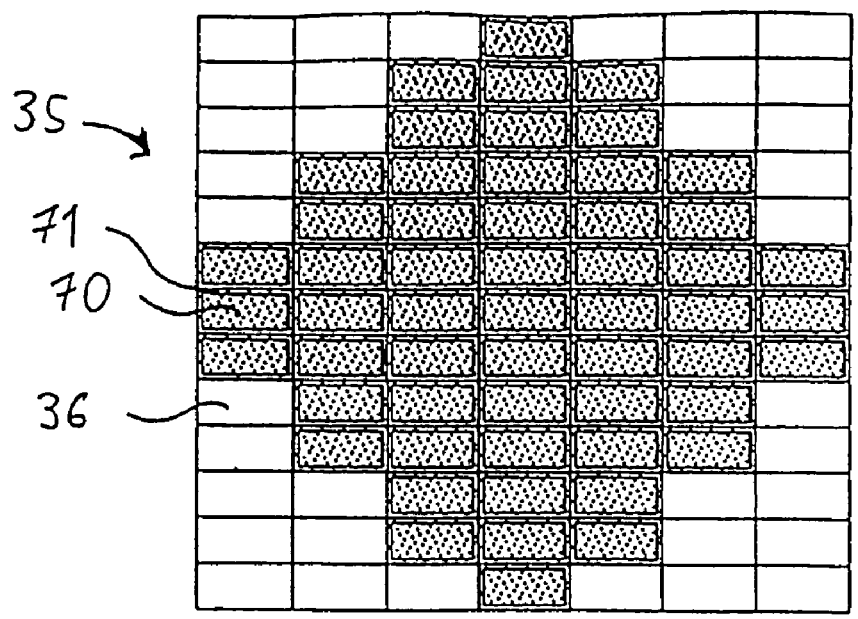
Figure 5:
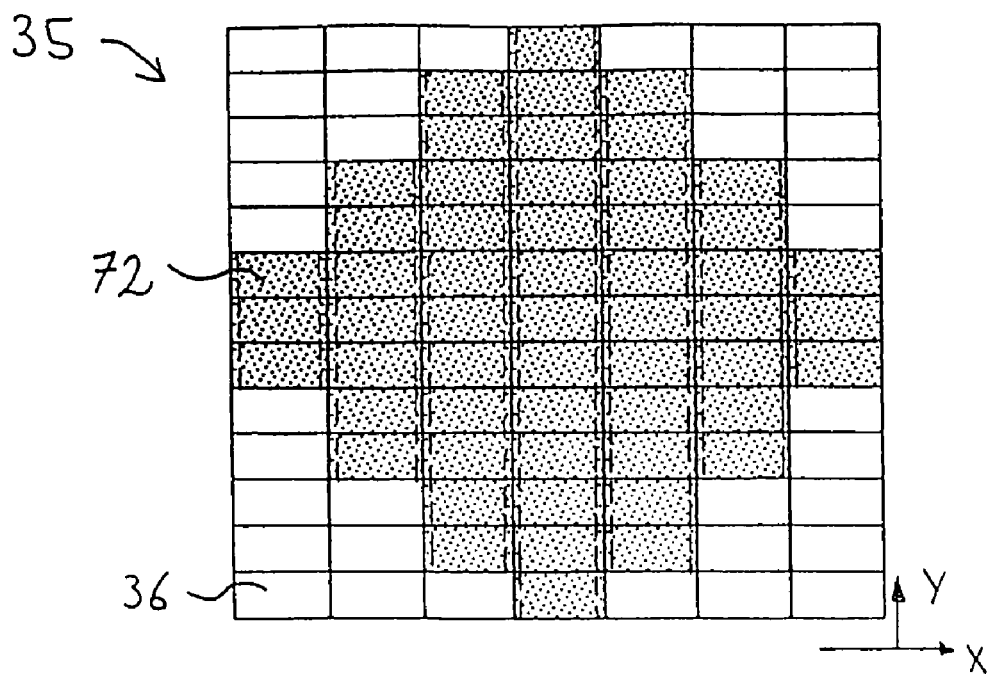
Figure 3:
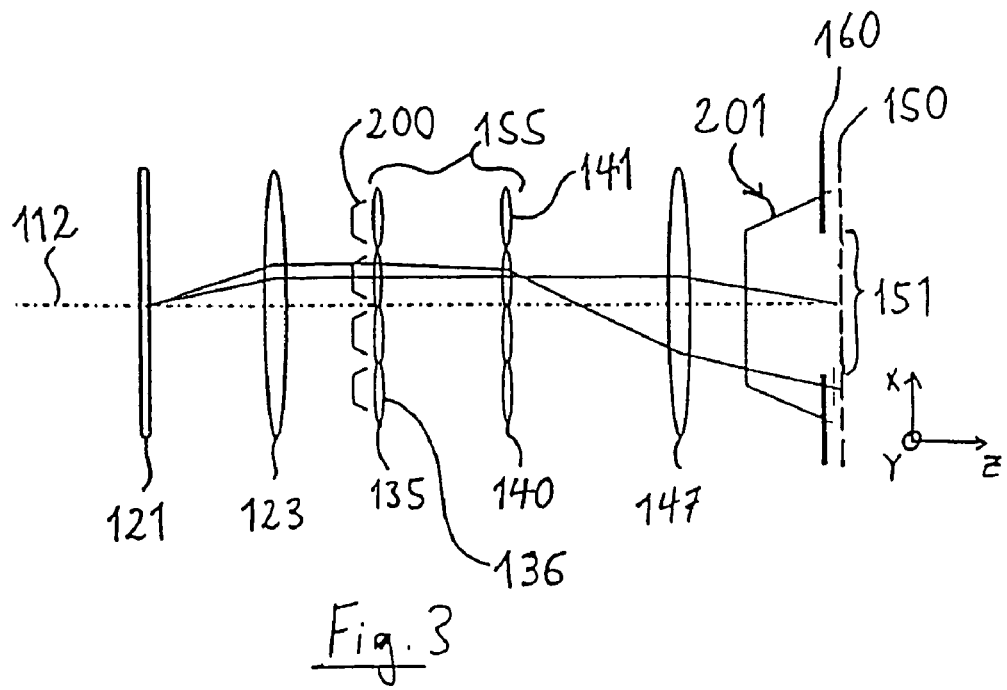
Figure 4:
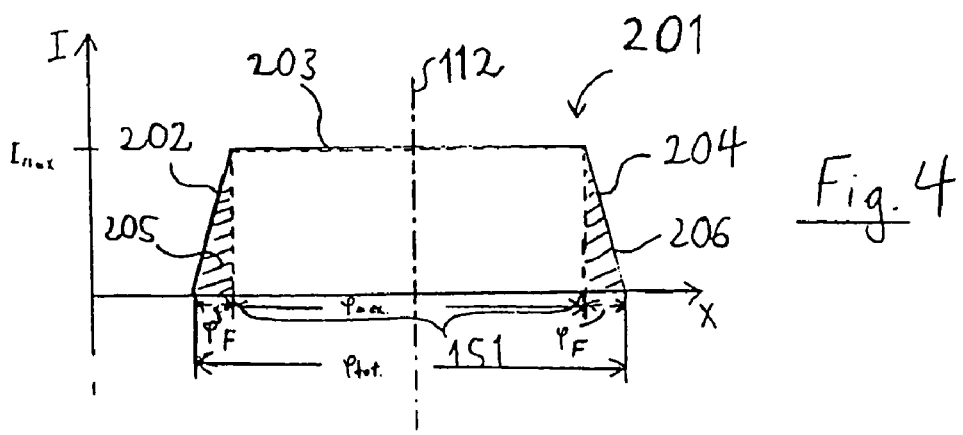

FIG. 1 schematically shows an embodiment of an illumination system according to the invention for a microlithography projection exposure apparatus comprising a first and a second raster arrangement, FIG. 2 shows a schematic plan view of the first raster arrangement from FIG. 1 with an essentially circular intensity distribution with luminous zones separate from one another, FIG. 3 schematically shows a greatly simplified representation of the illumination system from FIG. 1 for illustrating the intensity profile provided by the diffractive optical element on the first raster arrangement and also on the illumination field, FIG. 4 shows a diagram for illustrating the intensity profile on the illumination field, and FIG. 5 shows a schematic plan view of the first raster arrangement from FIG. 1 with an essentially circular intensity distribution with contiguous luminous zones.

FIG. 1 shows an example of an illumination system 10 of a microlithographic projection exposure apparatus, to put it more precisely of a wafer scanner, which can be used in the production of semiconductor components and other finely structured devices and operates with light from the deep ultraviolet range in order to achieve resolutions down to fractions of micrometers. The scanning direction of the wafer scanner (y direction) runs perpendicular to the plane of the drawing. An $F_2$ laser having an operating wavelength of approximately 157 nm serves as a primary light source 11, the light beam of said laser being oriented coaxially with respect to the optical axis 12 of the illumination system. Other UV light sources, for example ArF excimer lasers having an operating wavelength of 193 nm, KrF excimer lasers having an operating wavelength of 248 nm and also primary light sources having longer or shorter operating wavelengths are likewise possible.

The light beam having a small rectangular cross section that comes from the laser firstly impinges on a beam expansion optic 13, which generates an emerging beam 14 with largely parallel light and a larger rectangular cross section. The "largely parallel light" has a low laser divergence, which is lower than the divergence of the incident beam by the expansion factor of the beam expansion optic. The beam expansion optic may contain elements that serve for reducing the coherence of the laser light. The largely parallelized laser light then impinges on a diffractive optical element 21 embodied as a computer-generated hologram for generating an angular distribution. The angular distribution generated by the diffractive optical element 21 is converted into a two-dimensionally location-dependent intensity distribution upon passing through a Fourier lens arrangement 23 positioned in the focal length of the diffractive optical element. The intensity distribution thus generated is therefore present on a first surface 25 of the illumination system.

Situated in the vicinity of the first surface 25 or coinciding with the latter is the entrance surface of a first raster arrangement 35 having first raster elements 36 embodied as microlenses having a positive refractive power and a rectangular cross section with a large aspect ratio between width and height (cf. FIG. 2). The rectangular form of the microlenses 36 corresponds to the rectangular form of the field to be illuminated (the scanner field of a wafer scanner), for which reason the first raster elements are also referred to as field fly's eye elements 36. The first raster elements 36 are arranged in a manner directly adjoining one another, that is to say in a manner essentially filling the area, in a rectangular raster (Cartesian raster) corresponding to the rectangular form of the field fly's eye elements.

The diffractive optical element 21 has the effect that the light incident in the first surface 25 is split into a number of rectangular luminous zones 70 corresponding to the number of individual lenses 36 to be illuminated, said luminous zones being focused according to the refractive power of the microlenses 36 in the respectively associated focus regions thereof. This gives rise to a number of secondary light sources corresponding to the number of illuminated lenses 36, said secondary light sources being arranged in a raster arrangement. In this case, the individual positions of the secondary light sources are determined by the respective focus positions of the individual lenses 36.

Arranged at a distance downstream of the first raster arrangement 35 is a second raster arrangement 40 having second raster elements 41, which, in the case of the example, are likewise embodied as microlenses having a positive refractive power. The second raster elements are also referred to as pupil fly's eye elements and are arranged in the region of a second surface 45 of the illumination system, which second surface is a Fourier-transformed plane with respect to the first surface 25. The second surface 45 is a pupil plane of the illumination system and, in the case of an illumination system incorporated into a projection exposure apparatus, is optically conjugate with respect to a pupil plane of the projection objective whose object plane (reticle plane) is illuminated with the aid of the illumination device. The second raster elements 41 are arranged in the vicinity of the respective secondary light sources and, via a zoomable field lens 47 disposed downstream, image the field fly's eye elements 36 into an illumination surface 50 of the illumination system, the rectangular illumination field 51 lying in said illumination surface. In this case, the rectangular images of the field fly's eye elements 36 are at least partially superimposed in the region of the illumination field 51. This superimposition homogenizes, or makes more uniform, the light intensity in the region of the illumination field 51.

In this illumination system, the raster elements 35, 40 perform the function of a light mixing device 55, which serves for homogenizing the illumination in the illumination field 51 and which is the sole light mixing device of the illumination system.

The illumination surface 50, in which the illumination field 51 lies, is a field intermediate plane of the illumination system in which a reticle masking system (REMA) 60 is arranged, which serves as an adjustable shading diaphragm for generating a sharp edge of the intensity distribution. The downstream objective 65 images the intermediate field plane with the masking system 60 onto the reticle (the mask or the lithography original) situated in the reticle plane 69. The construction of such imaging objectives 65 is known per se and is therefore not explained in any further detail here. There are also embodiments without such an imaging system; in these embodiments, the illumination surface 50 may coincide with the reticle plane (object plane of a downstream projection objective).

With the illumination system 10 it is possible, in a simple manner, to provide different illumination modes by virtue of the fact that, for generating different light distributions which are fixedly predeterminable in each case, the diffractive optical element 21 is exchanged, by means of a changeover device 20 embodied as a linear changeover unit, for a diffractive optical element with a different emission characteristic that is provided in the changeover device 20. A diffractive optical element 22 provided for exchange is shown by way of example in the interior of the linear changeover unit 20. By exchanging diffractive optical elements, it is possible to generate e.g. different degrees of coherence (a gradations) that are fixedly predeterminable in each case, e.g. between 0.05 and 0.1. As an alternative, for generating different illumination modes, it is also possible to use an individual diffractive optical element having a plurality of differently structured partial regions for generating a number of light distributions corresponding to the number of partial regions.

This illumination system forms, together with a projection objective (not shown) and an adjustable reticle holder that holds the reticle in the object plane of the projection objective (reticle plane 69), a projection exposure apparatus for the microlithographic production of electronic devices, but also of diffractive optical elements and other microstructured parts.

In the case of the scanner system shown here, a narrow strip, typically a rectangle having an aspect ratio of 1:2 to 1:8, is illuminated on the reticle and the entire structured field of a chip is serially illuminated by scanning. Use in wafer steppers is also possible wherein the entire structured surface corresponding to a chip is illuminated as uniformly as possible and with as sharply delineated edges as possible.

Special features of the raster arrangement 35 of the light mixing device 55 are explained in more detail with reference to FIG. 2. In the schematically illustrated example, the first raster arrangement 35 comprises a square arrangement with a total of 91 rectangular microlens elements (first raster elements) 36 which are arranged in a manner directly adjoining one another one alongside another and one above another and fill the square area without any gaps. The rectangular form of the raster elements 36 having an aspect ratio between width and height of approximately 4:1 corresponds to the rectangular form of the field 51 to be illuminated. Those raster elements which are illuminated by the diffractive optical element 21 for generating an approximately circular exit light distribution and on which, therefore, a luminous zone 70 is in each case generated during operation of the illumination system are highlighted in FIG. 2. The illumination radiation impinges with maximum radiation intensity on each individual illuminated raster element apart from an edge region 71, so that the luminous zones 70 of the intensity distribution are not contiguous. By dispensing with the illumination of the edge regions 71 of the microlenses, it is possible to avoid light losses which arise as a result of the absorption of illumination radiation or light scattering in said edge regions, which are also referred to as dead zones.

FIG. 3 schematically shows a greatly simplified embodiment of an illumination system for illustrating the intensity profile provided by the diffractive optical element on the raster arrangement and also on the illumination field of the illumination system from FIG. 1. The components of the illumination system from FIG. 1 which are relevant to this illustration are represented by reference symbols increased by one hundred in FIG. 3. The divergence of the expanded laser perpendicular to the scanning direction, that is to say in the x direction in the plane of the drawing, is $D_L=1$ mrad. The angular distribution generated by the diffractive optical element 121 is convolved with the laser divergence and flattens the steep-edged angular distribution generated by said element, so that the intensity profile of the luminous zones 200 generated on the raster elements likewise has edges whose width is 1 mrad. The laser divergence or the divergence of the expanded radiation (here: 1 mrad) relates here to a spatial extent in the pupil plane (location of the raster element). The extent of the edge thus scales with the focal length of the lens 123. Given the small beam angles occurring here, angular dimensions can be converted 1:1 into linear dimensions, so that linear values correspond to the divergence values, and use is made of said linear values hereinafter. The edges brought about on account of the laser divergence give rise to a trapezoidal intensity profile on the luminous zones 200 with a plateau 203 of constant intensity and also two edges 202, 204 with linearly decreasing intensity (top hat distribution). The trapezoidal intensity profile of the luminous zones 200 is also found on the illumination field 151 again on account of the superimposition by the light distribution device 155.

FIG. 4 shows a diagram for illustrating the intensity profile on the illumination field perpendicular to the scanning direction (x direction). This is embodied symmetrically with respect to the optical axis 112 with a first, largely linearly rising edge 202, a plateau 203 of ideally constant light intensity $I_{max}$ and a second, linearly falling edge 204. The intensity in the plateau region, which in reality is normally not constant, is referred to here as "flat top intensity". The intensity distribution 201 should have a constant intensity (plateau) across the entire illumination field 151 which falls to zero in a narrowest possible region (edge) at the edges of the illumination field (top hat distribution). Since the intensity profile does not fall steeply enough, a diaphragm 156 shown in FIG. 3, for the purpose of generating sharp edges, clips the edge regions 205, 206 of the trapezoidal intensity profile 201 such that the intensity profile shown in dashed lines in FIG. 4 arises. The clipping or masking out of the edges gives rise to a transmission loss which should turn out to be as small as possible. In order to achieve this, care must be taken to ensure that the proportion (depicted by dashed lines) of beam intensity in the edge regions is as small as possible in comparison with the radiation proportion in region 206 of maximum intensity. This can be achieved e.g. by means of a narrowest possible edge width $\phi_F$. As already mentioned, the width $\phi_F$ of the region in which the intensity decrease occurs corresponds to the laser divergence $D_L$ at the location of the first raster elements ($D_L=\phi_F$).

The light mixing device 155 is intended to enable a best possible homogenization of the illumination radiation. This is generally all the better, the more raster elements 136, 141 contribute to the superimposition. However, the region illuminated with maximum beam power at an individual raster element is all the smaller, the more raster elements are available, since the ratio between (divergence-dictated) edge width and plateau width becomes less favorable (larger), the narrower the raster elements are. It is therefore necessary to find a compromise from homogeneity, given by the number of raster elements, and effective transmittance of the illumination radiation, limited by the necessity of masking out edge portions. For this purpose, it is possible, on the one hand, to prescribe a desired effective transmittance and to determine the maximum number of raster elements 136, 141 for which said effective transmittance can still be achieved. It is also possible, on the other hand, to prescribe the number of raster elements according to the desired homogenizing effect and to calculate the effective transmittance from this. The latter procedure is described below, the former procedure likewise being possible, of course.

Proceeding from a number n=11 of first and second raster elements 136, 141 for generating a predetermined homogenizing effect, only four of which are shown in order to simplify the illustration in FIG. 3, firstly the size of the angular range available for an individual element is determined. For this purpose, double the maximum divergence of the diffractive optical element $2D_{Max}$ (full aperture angle), which is approximately 60 mrad in the case under consideration here, is divided by the number of raster elements. An individual raster element therefore corresponds to an illumination angle of $\phi_{tot}$=60 mrad/11=5.4545 mrad. Given a laser divergence of $D_L$=$\phi_F$=1 mrad, the illumination angle of a raster element that is illuminated with maximum beam power is thus $\phi_{max}$=$\phi_{tot}$−2*$\phi_F$=5.4545 mrad−2 mrad=3.4545 mrad (in this respect, also cf. FIG. 4). The width of the region $\phi_{max}$ illuminated with maximum intensity corresponds to the width of the illumination field 151 in the x direction, that is to say that part of the illumination surface 150 which is not clipped by the diaphragm 160. The total radiation S which impinges per unit time on the illumination surface 150 results as an integral over the intensity, that is to say as the area which lies below the intensity distribution of FIG. 4. That part of the radiation which impinges with maximum beam power on the illumination surface results as $S_{max}$=$\phi_{max}$*$I_{max}$. In order to determine the effective transmittance T, this is to be related as a ratio to the total radiation impinging on the illumination surface 150. Said radiation is given by the total trapezoid area, that is to say the proportion $S_{max}$ plus the radiation of the light $S_F$ impinging on the two edge regions, that is to say the two hatched triangular areas 205, 206 in FIG. 4, so that $S_{tot}$=$S_{max}$+$S_F$=$\phi_{max}$*$I_{max}$+$\phi_F$*$I_{max}$.

In the present example, T=3.4545 mrad/(3.4545 mrad+1 mrad)=0.78. If a laser divergence of $D_L$=0.5 mrad is taken as a basis, then given an identical number of raster elements and identical $D_{Max}$ the result is an effective transmission T=4.4545 mrad/4.4545 mrad+0.5 mrad)=0.90. If the number of raster elements is increased e.g. to 21, then given the same conditions the result is an effective transmission value of T=1.86 mrad/(1.86 mrad+0.5 mrad)=0.79. Consequently, if for example an effective transmittance of more than 80% is to be achieved, then given a laser divergence $D_L$ of between 0.5 and 1 mrad and a maximum divergence of the diffractive element $D_{max}$ of 30 mrad, a number of the raster elements of the first raster arrangement of between 10 and 22 proves to be a good compromise between effective transmittance of the fly's eye condenser and the homogenizing effect thereof.

Clipping the edges with a diaphragm 160 is only necessary perpendicular to the scanning direction, so that no loss of light occurs along the scanning direction. As a result, a plurality of raster elements with contiguous luminous zones can be illuminated in the scanning direction without a reduction of the transmission occurring. When a wafer stepper is used, by contrast, care should be taken to ensure that the illumination field has edges that are as steep as possible in two spatial directions.

FIG. 5 shows a schematic plan view of the first raster arrangement from FIG. 1 with a contiguous, essentially circular intensity distribution. The portion of the raster elements 36 which is provided for generating the exit light distribution is covered by luminous centers 72 which are illuminated without interspaces. Although such illumination is not optimal for the transmission if steep edges of the illumination field 151 are required, since masking out involves the loss of a higher proportion of the illumination light than in the example shown in FIG. 2, the radiation loading on the material of the raster elements is lower in this case. It is also possible to fill only the interspaces in the y direction (scanning direction), but to leave unilluminated the interspaces in the x direction perpendicular thereto, as shown in FIG. 2. This variant is illustrated by dashed lines in FIG. 5. As a result, in scanner systems, the material loading on the raster elements can be reduced without a loss of transmission. A corresponding diffractive optical element would thus generate a stripe pattern with striped intensity regions (luminous zones) which run continuously in the y direction and between which there are small spacings in the x direction.

A coarse rastering in the radial direction has been achieved here on the basis of exemplary embodiments with relatively few fly's eye elements. However, a field fly's eye plate and/or a pupil fly's eye plate may also contain significantly more than the raster elements shown, for example more than 20 or more than 50 or more than 100 or more than 200-500 raster elements. A fine rastering—adapted to the requirements—of the intensity distributions generated can be achieved as a result of this.

The invention has been explained on the basis of exemplary embodiments in which all the raster elements comprise lenses made of a material that is transparent to the light at the operating wavelength, for example calcium fluoride. Depending on the area of application, the raster arrangements 35, 40 may also be formed by mirrors or diffractive structures. Illumination systems suitable for EUV may be provided as a result.

Although it is normally sufficient to set the illumination modes by changing diffractive optical elements or a plurality of partial regions of a diffractive optical element, it may be advisable in specific cases to provide in addition adjustable optical elements between the primary light source and the first raster arrangement.

The invention claimed is:

1. An illumination system for a microlithography projection exposure apparatus for illuminating an illumination field with light from a primary light source, comprising:
a light distribution device receiving light from the primary light source and generating a predetermined, two-dimensional intensity distribution from the light from the primary light source in a first surface of the illumination system;
a first raster arrangement comprising first raster elements receiving the spatial, two-dimensional intensity distribution and generating a raster arrangement of secondary light sources;
a second raster arrangement comprising second raster elements receiving light from the secondary light sources and at least partially superimposing light from the secondary light sources in the illumination field;
the light distribution device comprising at least one diffractive optical element generating an angular distribution whose far field has separate or contiguous luminous zones which are coordinated in terms of form and size with the form and size of individual first raster elements of the first raster arrangement.

2. The illumination system as claimed in claim 1, wherein the diffractive optical element sets a two-dimensional intensity distribution in the first surface such that all first raster elements associated with a predetermined exit light distribution are at least essentially completely illuminated by the intensity distribution, while first raster elements which do not contribute to the exit light distribution remain at least essentially unilluminated.

3. The illumination system as claimed in claim 1, wherein the diffractive optical element is configured such that the luminous zones generate at least one of an at least approximately circular, at least approximately annular, or at least approximately dipole or multipole intensity distribution with a rastering corresponding to a form and size of the first raster elements onto the raster elements of the first plane.

4. The illumination system as claimed in claim 1, wherein no zoom device is arranged between the primary light source and the first raster arrangement.

5. The illumination system as claimed in claim 1, wherein no axicon system is arranged between the primary light source and the first raster arrangement.

6. The illumination system as claimed in claim 1, wherein no variably adjustable optical component is arranged between the primary light source and the first raster arrangement.

7. The illumination system as claimed in claim 1, wherein the light distribution device comprises a changeover device for exchanging a first diffractive optical element generating a first, two-dimensional intensity distribution for at least one second diffractive optical element generating a second, two-dimensional intensity distribution different from the first intensity distribution.

8. The illumination system as claimed in claim 1, wherein the diffractive optical element has two or more differently structured partial regions which configured for introduction into the beam path of the illumination system for generating a number of different, two-dimensional light distributions corresponding to the number of partial regions.

9. The illumination system as claimed in claim 1, wherein the diffractive optical element is configured such that at least one luminous zone completely illuminates at least one raster element.

10. The illumination system as claimed in claim 1, wherein the diffractive optical element is configured such that at least one luminous zone illuminates with maximum intensity at least one raster element apart from a narrow edge region.

11. The illumination system as claimed in claim 1, wherein the primary light source is a laser having a divergence $D_L$ in at least one plane containing the light propagation direction of the light, wherein a maximum divergence of the diffractive optical element in the plane is $D_{MAX}$, and wherein the number n of the raster elements of the first raster arrangement, for generating a homogenizing effect, is predetermined such that a defined ratio (effective transmittance T) of the proportion of radiation impinging on the first raster element with flat top intensity to the total radiation impinging on the first raster element is not undershot.

12. The illumination system as claimed in claim 1, wherein the effective transmittance T is greater than 70%.

13. The illumination system as claimed in claim 1, wherein the primary light source is a laser having a divergence of between 0.5 and 1 mrad in at least one plane containing the light propagation direction of the light, wherein the maximum divergence of the diffractive element in the plane is 30 mrad, and wherein the number of raster elements of the first raster arrangement in the plane lies between 10 and 22.

14. The illumination system as claimed in claim 1, wherein the diffractive optical element is embodied as a computer-generated hologram.

15. The illumination system as claimed in claim 1, wherein the raster elements of at least one of the first raster arrangement and the second raster arrangement are embodied as microlenses.

16. The illumination system as claimed in claim 1, wherein a shading diaphragm generating a sharp edge of the intensity distribution is provided in a vicinity of the illumination surface or in a vicinity of a conjugate plane of the illumination surface.

17. The illumination system as claimed in claim 1, wherein at least one Fourier lens arrangement is arranged between the diffractive optical element and the first raster arrangement.

18. A method for producing at least one of semiconductor components and other finely structured devices, comprising:
   illuminating a reticle arranged in an object plane of a projection objective with light from a primary light source with an illumination system embodied as claimed in claim 1; and
   generating an image of the reticle on a light-sensitive substrate;
   wherein, for illuminating the reticle, the diffractive optical element generates a two-dimensional intensity distribution formed as luminous zones on the first surface of the illumination system, a spatial distribution of which corresponds at least essentially to the form of a predetermined exit light distribution.

19. The method as claimed in claim 18, further comprising changing over illumination modes of the illumination system exclusively by at least one of exchanging the diffractive optical element and introducing differently structured partial regions of the diffractive optical element into the beam path of the illumination system.

20. An illumination system for a microlithography projection exposure apparatus for illuminating an illumination field with light from a primary light source, comprising:
   a light distribution device receiving light from the primary light source and generating a predetermined, two-dimensional intensity distribution from the light from the primary light source in a first surface of the illumination system;
   a first raster arrangement comprising first raster elements receiving the spatial, two-dimensional intensity distribution and generating a raster arrangement of secondary light sources;
   a second raster arrangement comprising second raster elements receiving light from the secondary light sources and at least partially superimposing light from the secondary light sources in the illumination field;
   wherein the light distribution device comprises at least one diffractive optical element that generates separate or contiguous luminous zones that are matched in form and size to individual raster elements within a subset of the first raster elements of the first raster arrangement.

* * * * *